(12) United States Patent
Shiina et al.

(10) Patent No.: US 6,597,578 B2
(45) Date of Patent: Jul. 22, 2003

(54) ELECTRICAL CONNECTION BOX

(75) Inventors: Kaori Shiina, Mie (JP); Takayuki Sakakura, Mie (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/200,871

(22) Filed: Jul. 23, 2002

(65) Prior Publication Data

US 2003/0030996 A1 Feb. 13, 2003

(30) Foreign Application Priority Data

Jul. 23, 2001 (JP) ........................................ 2001-222008

(51) Int. Cl.[7] ................................................ H05K 7/00
(52) U.S. Cl. ........................ 361/728; 361/752; 361/826; 361/628; 361/629; 361/641
(58) Field of Search ................................ 361/728, 736, 361/748–752, 627–629, 641–648, 826–829, 784; 439/76.1, 76.2, 74–75, 949; 174/50, 50.52, 52.1, 52.2

(56) References Cited

U.S. PATENT DOCUMENTS

| | | | | |
|---|---|---|---|---|
| 3,614,541 A | * | 10/1971 | Farrand | ...................... 361/730 |
| 4,781,600 A | * | 11/1988 | Sugiyama et al. | ............. 439/45 |
| 4,850,884 A | * | 7/1989 | Sawai et al. | .................... 439/76 |
| 4,995,818 A | * | 2/1991 | Saimoto | ....................... 439/74 |
| 5,011,417 A | * | 4/1991 | Matsumoto et al. | ........... 439/76 |
| 5,667,389 A | * | 9/1997 | Kidd et al. | .................... 439/75 |
| 5,822,189 A | | 10/1998 | Isshiki | |
| 5,877,944 A | * | 3/1999 | Onizuka | ...................... 361/826 |
| 5,995,380 A | * | 11/1999 | Maue et al. | ................. 361/826 |
| 6,430,054 B1 | * | 8/2002 | Iwata | .......................... 361/752 |
| 6,437,986 B1 | * | 8/2002 | Koshiba | ....................... 361/752 |
| 6,494,722 B1 | * | 12/2002 | Sakamoto et al. | .......... 439/76.2 |
| 6,506,060 B2 | * | 1/2003 | Sumida et al. | .............. 439/76.2 |

* cited by examiner

Primary Examiner—David Martin
Assistant Examiner—Phuong T. Vu
(74) Attorney, Agent, or Firm—Harness, Dickey & Pierce, P.L.C.

(57) ABSTRACT

An electrical connection box has an electric circuit board. A plurality of blocks are selectively mountable on the periphery of the electric circuit board. The selected ones of the blocks form sidewalls that surround the periphery of the electric circuit board. The blocks are selected from the group including (a) at least one electric component mounting block for accommodating an electric component; (b) at least one external circuit connection block for accommodating an external circuit connector; and (c) at least one solid, sidewall block for forming a portion of the sidewalls.

18 Claims, 13 Drawing Sheets

ELECTRICAL CONNECTION BOX

CROSS-REFERENCE TO RELATED APPLICATIONS

This application claims priority to Japanese Patent Application No. JP2001-222008, filed Jul. 23, 2001, which application is hereby expressly incorporated by reference.

FIELD OF THE INVENTION

The present invention relates to an electrical connection box, particularly an electrical connection box capable of increasing a degree of freedom in circuit design as well as providing flexibility to accommodate different vehicle specifications. Further, the present invention relates to a method of producing such an electrical connection box.

BACKGROUND OF THE INVENTION

Vehicles carry electrical connection boxes that accommodate electric devices such as fuses, relays and diodes. These electrical connection boxes connect wire harnesses routed throughout the vehicle body. Many types of electrical connection boxes have been tailored for particular circuit design requirements for different vehicle types and specifications.

A known electrical connection box 1 is shown in FIG. 13. The electrical connection box accommodates internal circuits in upper and lower cases 1a, 1b. The internal circuits are stacked in layers, composed of a layer of single-core wires 2 routed in a predetermined configuration. A bus bar 4 is punched into a predetermined configuration. The bus bar 4 is placed on an upper surface of an insulation plate 3 which is interposed between the single-core wires 2 and the bus bar 4. The internal circuits are also composed of a printed circuit board 6 disposed above the bus bar 4. An insulation plate 5 is interposed between the bus bar 4 and the printed circuit board 6.

Connection tabs 7 make pressure grip connections with the single-core wires 2, while they are inserted into connector accommodating portions 1c provided on a lower surface of the lower case 1b. Similarly, connection tabs 4a, projecting upwardly and downwardly from the bus bar 4, and connection tabs 6a, mounted on the print circuit board 6, are inserted into the connector accommodating portions 1c as well as into electric device mounting portions 1d and connector accommodating portions 1e provided on an upper surface of the upper case 1a. Relay terminals 8 are used to electrically connect the internal circuits arranged in different layers. Electric devices such as fuses F are mounted into the electric device mounting portions 1d. External connectors, such as connectors C attached to ends of wire harnesses W/H constituting external circuits, are mounted into the connector accommodating portions. Accordingly, an electrical connection is established between the internal and external circuits.

The installation position of the electrical connection box 1 to be mounted to the vehicle body is restricted by the positions of the electric device mounting portions 1d accommodating the fuses F. The electrical connection box 1 is installed so that the electric device mounting portions 1d face toward a passenger compartment side. This mounting enables ready replacement of the fuses F, when needed. In addition, the internal circuits of the electrical connection box may be configured in a different manner. For example, the internal circuits may be composed of bus bar layers and insulation layers only, or composed of single-core wire layers and insulation layers only.

The present invention seeks to solve the following problems of the conventional electrical connection box. First, the internal circuits of the electrical connection box 1 are specially designed for a particular type of vehicle accommodating the electrical connection box 1. Also, the upper and lower cases 1a, 1b, which accommodate such internal circuits, are specially designed according to the constructions of the internal circuits as well as to the configurations of the electric devices and the external connectors of the external circuits. Thus, a different punching die, used to form a bus bar, and a different injection mold, used to produce upper and lower cases, are necessary for every different type of vehicle. Therefore, production cost is extremely high.

Moreover, even if the conventional electrical connection boxes are utilized for the same type of vehicles, since vehicle body portions and components mounted thereon are often improved or modified during minor change periods, it is often necessary to alter the internal circuit construction of the electrical connection box and the connection construction of the electric devices in accordance with such improvements and modifications. When this happens, it is necessary to design and develop a new die and mold, which also undesirably increases cost.

Second, since the installation position of the electrical connection box 1 is restricted by the positions of the electric device mounting portions 1d and connector accommodating portions 1e provided on the upper case 1a, the degree of freedom of installation is low. Accordingly, efficient installation may be hindered.

Third, when electrically interconnecting the different wires constituting the wire harness W/H connected to the electrical connection box 1, a circuit portion which enables the electrical interconnection between the wires must be additionally formed in the internal circuit. This increases the number of circuits in the internal circuit, further complicating the circuit configuration.

Fourth, in the event where bus bars are employed in the internal circuits, since the bus bars are formed from sheet metal with a predetermined thickness, the weight of the internal circuits tends to increase. This problem is significant, especially when the internal circuits are formed by a plurality of bus bar layers.

SUMMARY OF THE INVENTION

The present invention overcomes the above disadvantages. An object of the present invention is to provide an improved electrical connection box that accommodates different vehicle types or design changes by selectively employing suitable common parts which, in turn, reduces cost. Another object of the invention is to increase the degree of freedom of installation of the electrical connection box to a vehicle body. This improves installation efficiency. Yet another object is to reduce the weight of the electrical connection box.

In a preferred form the electrical connection box includes an electric circuit board with internal circuits. The electric circuit board has connection portions. A plurality of blocks are mounted on the periphery of the electric circuit board, forming sidewalls that surround the periphery of the electric circuit board. The blocks mounted on the electric circuit board may be any of the following:

(a) at least one electrical component mounting block to accommodate an electrical component adapted for an electrical connection with the connection portion of the electric circuit board;

(b) at least one external circuit connection block to accommodate an electrical connector adapted for an electrical connection of an external circuit to the connection portion of the electric circuit board; and (c) at least one solid, sidewall block to form a portion of the sidewalls.

In one aspect of the present invention, upper and lower covers are fixedly mounted to at least one of the selected ones of the blocks, covering the electric circuit board from above and below.

In a further aspect of the present invention, the electric circuit board has side edges on its periphery. The blocks each include a slit that opens to receive the side edge of the electric circuit board.

In a further aspect of the present invention, the connection portions are arranged side by side on at lease one of the side edges. The electric component mounting blocks and the external circuit connection blocks each include electrical terminals. The terminals are arranged side by side and engage the corresponding connection portions of the side edge for electrical connection when the selected ones of the electric component mounting blocks and the selected ones of the external circuit connection blocks are mounted to the side edges of the electric circuit board.

Preferably, the terminals include intermediate connection terminals. The terminals electrically connect contact portions of the electric components and the connector accommodated in the selected ones of the electric component mounting blocks and the selected ones of the external circuit connection blocks to the corresponding connection portions of the side edges of the electric circuit board. Also, at least one joint portion may be provided to electrically connect at least two of the intermediate connection terminals.

In a further aspect of the present invention, the electric circuit board is rectangular-shaped with four side edges on the periphery. At least four selected ones of the blocks are mounted to the four side edges of the electric circuit board, completely surrounding the entire periphery of the electric circuit board.

In a further aspect of the present invention, the at least four selected ones of the blocks are selected according to predetermined circuitry and structural constructions of the electrical connection box.

In a further aspect of the present invention, a plurality of selected ones of the blocks are mounted to the side edge of the electric circuit board. Each of the plurality of selected ones of the blocks has a length shorter than a length of the side edge.

In a further aspect of the present invention, the external circuit connection block has a connector accommodating portion at a first surface. The accommodating portion accommodates a first connector connected to a first wire harness which constitutes a first external circuit. A first slit is formed in a second surface which is disposed substantially parallel to the first surface. The first slit is dimensioned to receive the side edge of the electric circuit board in a first direction. A second slit is formed in a third surface which is disposed adjacent the first and second surfaces. The third surface extends substantially perpendicular to the first and second surfaces. The second slit is dimensioned to receive a first side edge of an auxiliary circuit board in a second direction substantially perpendicular to the first direction. One of the upper and lower covers has an external circuit connector port to accommodate a second connector which is connected to a second wire harness, constituting a second external circuit. The external circuit connector port has a third slit dimensioned to receive a second side edge, which is opposite to the first side edge of the auxiliary circuit board, in a third direction opposite to the second direction.

In a further aspect of the present invention, the external circuit connection block has an intermediate connection terminal. The intermediate connection terminal has three contact fingers. The first contact finger of the intermediate connection terminal is provided for electrical connection with a connection portion on the side edge of the electric circuit board. The second contact finger extends in a direction opposite to the first contact finger for electrical connection with a contact member in the first connector. The third contact finger extends in a direction substantially perpendicular to the first and second contact fingers for electrical connection with a connection portion on the first side edge of the auxiliary circuit board.

In a further aspect of the present invention, the selected ones of the blocks each include a plurality of slits spaced apart a predetermined distance in an upward-downward direction. A plurality of electric circuit boards are mounted to the slits so that the electric circuit boards are stacked and spaced apart at the predetermined distance in the upward-downward direction.

Preferably, the selected ones of the blocks each have a plurality of intermediate connection terminals. The terminals are arranged side by side and spaced apart at the predetermined distance in the upward-downward direction. At least one joint portion may be provided to connect at least two of the intermediate connection terminals. In a further aspect of the present invention, the electric circuit board includes a printed circuit board. Alternatively, the electric circuit board may include a bus bar.

In another preferred form, the present invention is directed to a method of producing an electrical connection box. The electrical connection box is produced by:

(a) providing an electric circuit board constituting internal circuits and having connection portions;

(b) preparing a predetermined number of different types of electric component mounting blocks to accommodate at least one electric component for an electrical connection with the connection portions;

(c) preparing a predetermined number of different types of external circuit connection blocks to accommodate at least one external circuit connector for an electrical connection with the connection portions;

(d) preparing a predetermined number of different types of solid sidewall blocks; and (e) selectively mounting, to portions of the periphery of the electric circuit board, a plurality of blocks from among the electric component mounting blocks, the external circuit connection blocks and the sidewall blocks in accordance with predetermined circuitry and structural constructions of the electrical connection box. The plurality of blocks form sidewalls that completely surround the entire periphery of the electric circuit board.

In a further aspect of the present invention, the electric circuit board is produced for a particular vehicle specification accommodating the electrical connection box. The electric component mounting blocks, the external circuit connection blocks and the sidewall blocks are produced as common parts. Thus, the blocks can be selectively mounted to the electric circuit board in accordance with the particular vehicle specification.

From the following detailed description, taken in conjunction with the accompanying drawings and subjoined claims, other objects and advantages of the present invention will become apparent to those skilled in the art.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
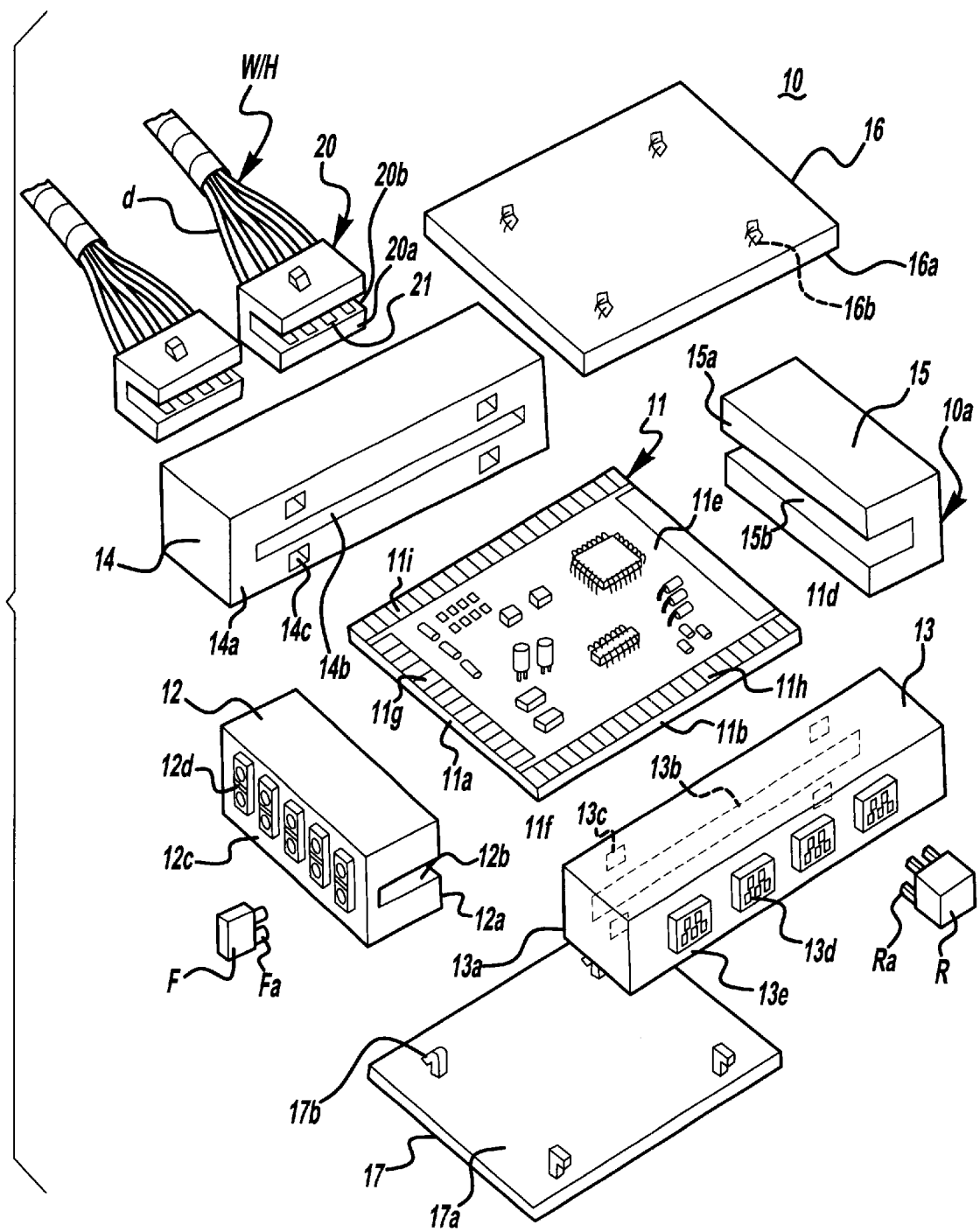
FIG. 1 is an exploded perspective view of an electrical connection box according to a first embodiment of the present invention.

FIG. 1 shows an electrical connection box 10 according to a first embodiment of the present invention. The internal circuits of the electrical connection box 10 include a rectangular-shaped printed circuit board 11, or an electric circuit board. The printed circuit board 11 is provided with side edges 11a, 11b, 11c, 11d. The side edges 11a, 11b are connectable to electric component mounting blocks such as fuse and relay blocks 12, 13. The side edge 11c is connectable to an external circuit connection block such as a connector block 14 for electrical connection of external circuits. The side edge 11d is connectable to a sidewall block 15. Blocks 12–15 are formed of resin, and are configured to form sidewalls 10a that surround the entire periphery of the printed circuit board 11 when they are mounted to side edges 11a, 11b, 11c, 11d. Plate-like upper and lower covers 16, 17 are mountable to cover upper and lower surface areas 11e, 11f of the printed circuit board 11.

The printed circuit board 11 is formed by pasting a metallic foil on a surface of a rigid board, then insulating it. The metallic foil is made of a thin conductive sheet, and cut into circuits. A plurality of conductive foils, continuous with the internal circuits, are juxtaposed at the side edges 11a, 11b, 11c, 11d. The juxtaposed conductive foils, which are exposed without being insulated, constitute connection portions such as fuse, relay and connector connection portions 11g, 11h, 11i, respectively. Since the sidewall block 15 is provided only to form a sidewall and not for electrical connection, the corresponding side edge 11d is not provided with a connection portion. The printed circuit board 11 is a double-sided circuit board. The circuit board includes the circuits and connection portions provided on both of the upper and lower surfaces 11e, 11f. Also, integrated circuits, resistors and capacitors are mounted on the upper and lower surfaces 11e, 11f of the printed circuit board 11.

Figure 2A:
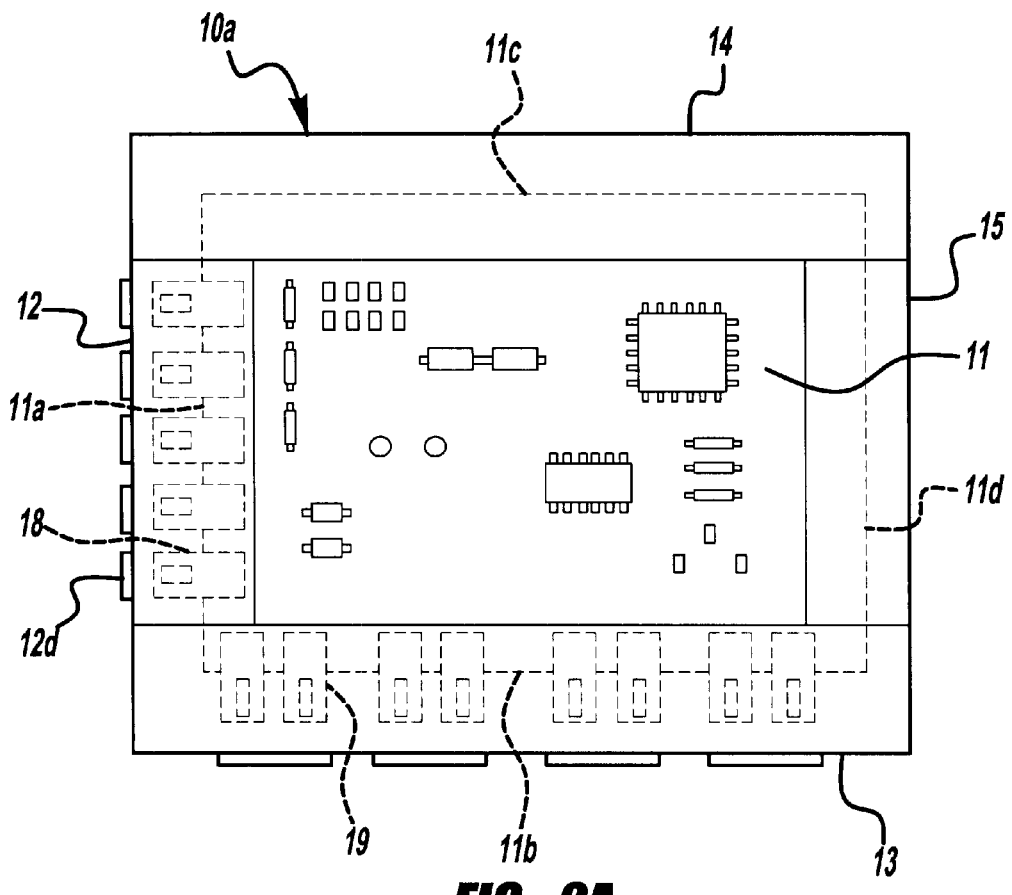
FIG. 2(A) is a plan view of the electrical connection box according to the first embodiment of the present invention, before an upper case is fitted.

As shown in FIG. 2(A), the lengths of the relay and connector blocks 13, 14 are greater than the lengths of the side edges 11b, 11c of the printed circuit board 11. The lengths of the fuse and sidewall blocks 12, 15 are shorter than the lengths of the side edges 11a, 11d of the printed circuit board 11. In this manner, the respective blocks 12, 13, 14, 15 are dimensioned and configured to surround the entire periphery of the printed circuit board 11 without exposing the board 11 after the blocks have been fitted.

Slits 12b, 13b, 14b, 15b are formed at mounting surfaces 12a, 13a, 14a, 15a of the respective blocks. The slits 12b, 13b, 14b, 15b extend laterally, and are sized to correspond to the thickness of the printed circuit board 11. Thus, the side edges 11a, 11b, 11c, 11d of the printed circuit board 11 can be inserted into the slits 12b, 13b, 14b, 15b. Accordingly, the blocks 12, 13, 14, 15 can be mounted respectively to the printed circuit board 11.

Figure 2B:
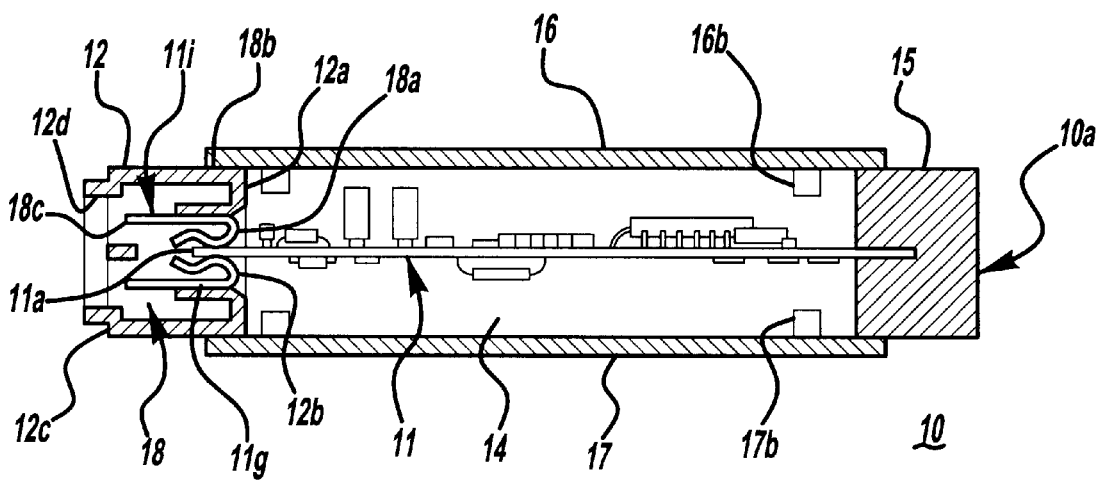
FIG. 2(B) is a side view in section of the electrical connection box according to the first embodiment of the present invention.

As best seen in FIG. 1, four locking projections 16b, 17b project from a bottom surface 16a of the upper cover 16 and a top surface 17a of the lower cover 17, respectively. Correspondingly, four locking recesses 13c, 14c are provided at the mounting surfaces 13a, 14a of the relay and connector blocks 13, 14, respectively. The upper and lower covers 16, 17 lock to the relay and connector blocks 13, 14 by locking the locking projections 16b, 17b to the corresponding locking recesses 13c, 14c. The covers 16, 17 cover the central openings formed by the surrounding blocks 12, 13, 14, 15, as shown in FIG. 2(B). Alternatively, the locking projections and recesses may be provided so that the upper and lower covers 16, 17 can be fixed with the four blocks 12, 13, 14, 15.

Figure 3A:
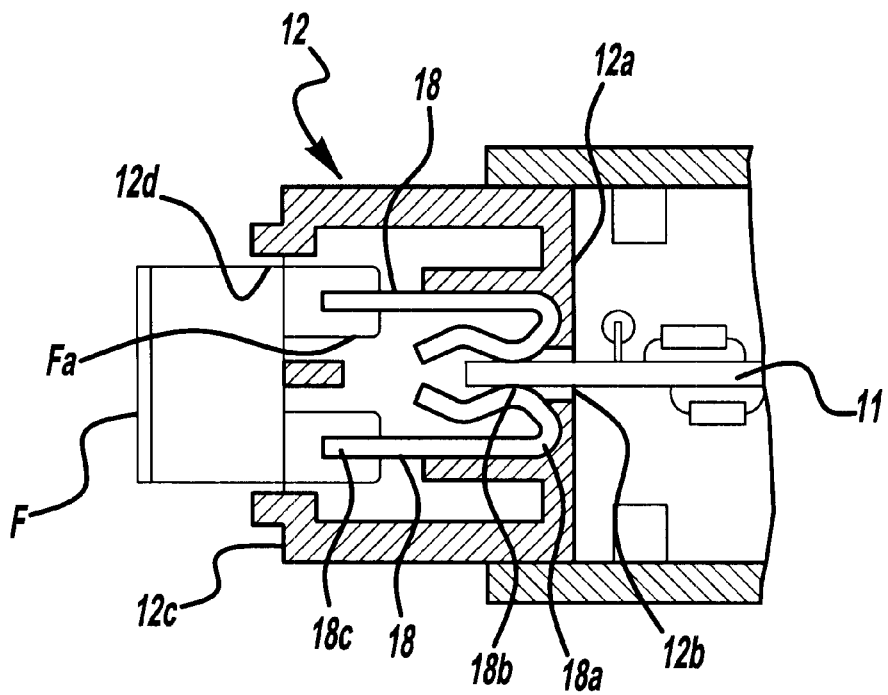
FIG. 3(A) is a cross-sectional view showing a fuse block according to the first embodiment of the present invention.
Figure 3B:
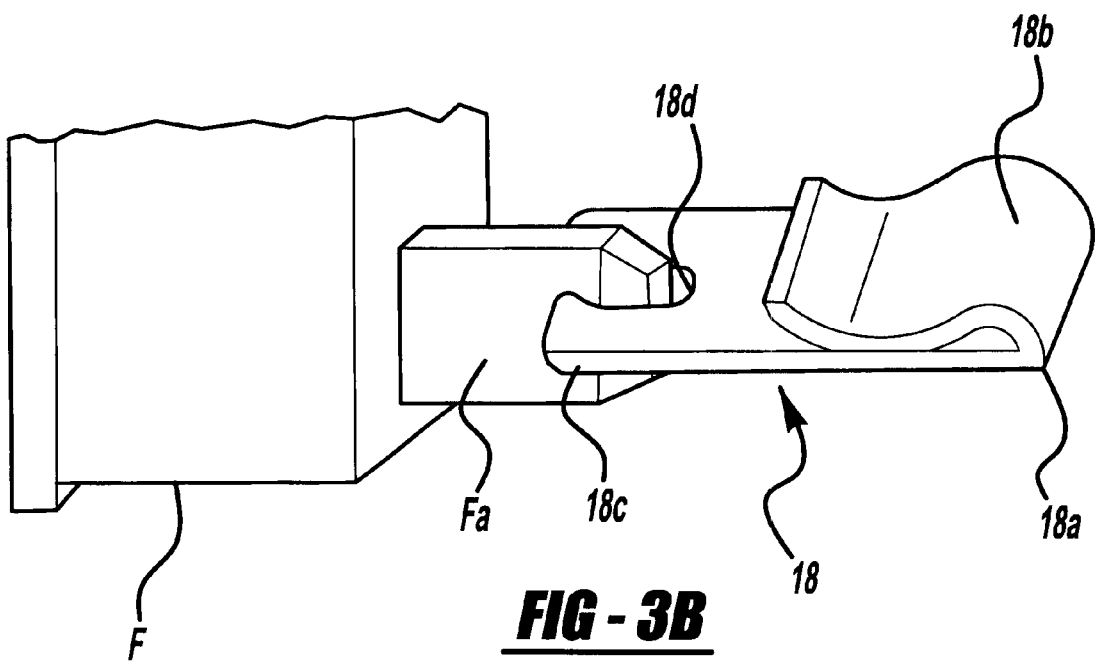
FIG. 3(B) is a schematic view showing the connection of a fuse terminal according to the first embodiment of the present invention.

As shown in FIGS. 1 and 2(A), the slit 12b provided at the mounting surface 12a of the fuse block 12 extends over the entire lateral length of the fuse block 12 to form openings at opposed side surfaces of the fuse block 12. At an outer side surface 12c of the fuse block 12, a fuse accommodating portion 12d, to accommodate a fuse F, is formed as an electric component mounting portion. As shown in FIGS. 2(B) and 3(A), a pair of upper and lower intermediate connection terminals 18 are fixedly disposed inside the fuse block 12. The intermediate connection terminals 18 extend from the fuse accommodating portion 12d side toward the slit 12b side above and below the slit 12b, respectively. As best seen in FIG. 3(B), the intermediate connection terminal 18, made of conductive metal material, has a curved contact portion 18b folded back at one end 18a and a pressure gripping portion 18d formed at the other end 18c.

As shown in FIG. 3(A), when the fuse block 12 is fitted to the printed circuit board 11, via the slit 12b, the contact portions 18b of the upper and lower intermediate connection terminals 18 engage the connection portions 11g on the top and bottom surfaces of the printed circuit board 11. When the fuse F is mounted, fuse-side contact portions Fa are connected by a pressure grip with the pressure gripping portions 18d disposed in the fuse accommodating portion 12d. Consequently, the fuse F can make an electrical connection with the internal circuits of the printed circuit board 11 via the intermediate connection terminals 18.

Relay block 13 has a similar configuration to the fuse block 12. As shown in FIGS. 1 and 2(A), a relay mounting portion 13d is formed at an outer side surface 13e of the relay block 13 as an electric component mounting portion. Intermediate connection terminals 19 are disposed inside the relay block 13. The intermediate connection terminal 19 for relay R has substantially the same configuration as the intermediate connection terminal 18 for fuse F. Thus, when the relay block 13 is fitted to the printed circuit board 11, the intermediate connection terminals 19 engage the connection portions 11h. When the relay R is mounted into the relay mounting portion 13d, relay-side contact portions Ra are connected with the intermediate connection terminals 19. Consequently, the relay R is electrically connected with the internal circuits of the printed circuit board 11. Incidentally, the slit 13b is not continuous with opposed side surfaces of the relay block so that the opposed side surfaces remain closed as shown in FIG. 1. As a result, the printed circuit board 11 is not exposed outwardly when the relay block 13 is assembled, as shown in FIG. 2(A).

Figure 4A:
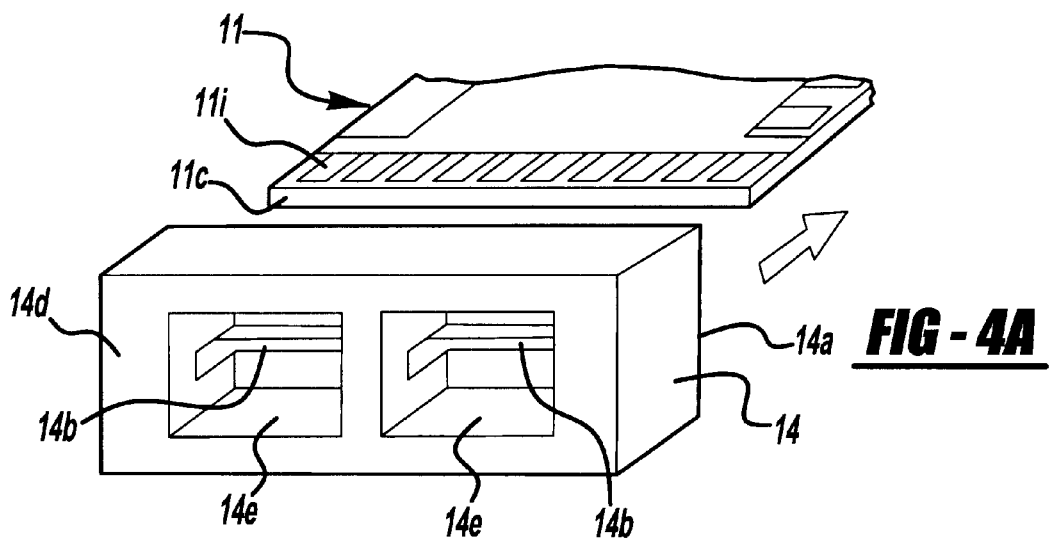
FIG. 4(A) is a schematic view showing the mounting process of a connector block to a circuit board according to the first embodiment of the present invention.
Figure 4B:
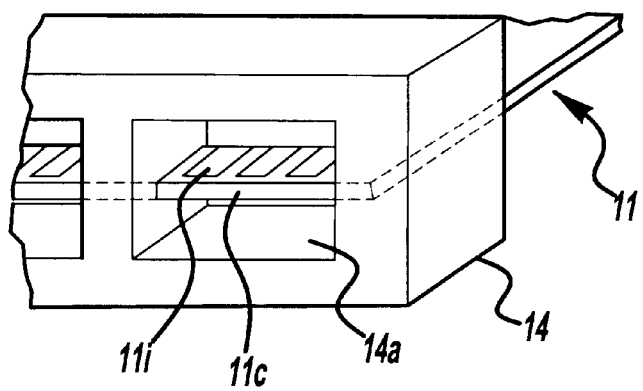
FIG. 4(B) is a schematic view showing the mounting process of a connector block to a circuit board according to the first embodiment of the present invention.

Further, as shown in FIGS. 4(A) and 4(B), a connector accommodating portion 14e is recessed at an outer side surface 14d of the connector block 14. The connector accommodating portion 14e communicates with the slit 14b. Accordingly, when the connector block 14 is fitted to the side edge 11c of the printed circuit board 11, via the slit 14b, the connection portions 11i are disposed in the connector accommodating portion 14e as shown in FIG. 4(B). The slit 14b does not extend through opposed side surfaces of the connector block 14, like the slit 13b of the relay block 13. Thus, the printed circuit board 11 is not exposed when the connector block 14 is assembled, as shown in FIG. 2(A).

Figure 4C:
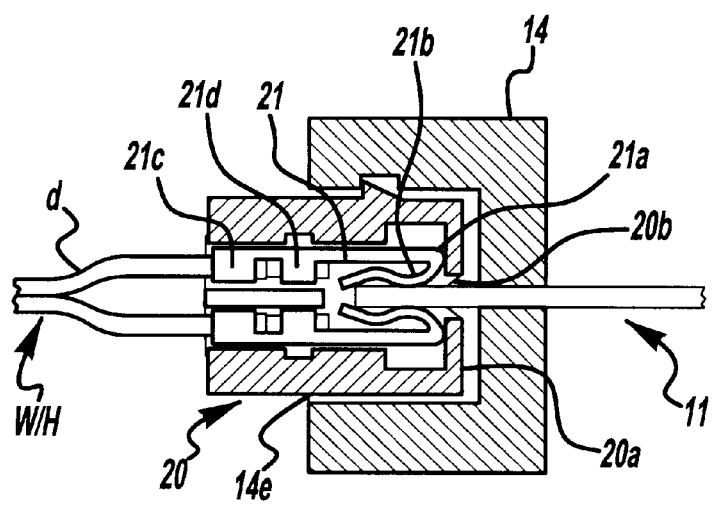
FIG. 4(C) is a cross-sectional view showing the mounting condition of the connector block according to the first embodiment of the present invention.

A connector 20 in the form of a so-called card-edge type connector is shown in FIG. 1, which is secured to an end of a wire harness W/H constituting an external circuit, is mountable to the connector block 14. A groove 20b is formed at a front end surface 20a of the connector 20. A pair of upper and lower connector terminals 21 are inserted within the connector 20, and disposed above and below the groove 20b, as shown in FIG. 4(C). A contact portion 21b is formed at one end 21a of the connector terminal 21. The contact portion 21b has substantially the same configuration as those of the intermediate connection terminals 18, 19. A barrel portion 21 is formed at the other end 21c of the connector terminal 21. The barrel portion 21 is crimped onto a wire d constituting the wire harness W/H.

When the connector 20 is inserted into the connector accommodating portion 14e in the state of FIG. 4(B), the side edge 11c of the printed circuit board 11 is directly inserted through the groove 20b of the connector 20. The contact portions 21b of the connector terminals 21 engage the connection portions 11i of the printed circuit board 11, as shown in FIG. 4(C). This establishes an electrical connection between the internal circuits of the printed circuit board 11 and the external circuits of the wire harness W/H.

The sidewall block 15 is solid and formed of resin. Since the sidewall block 15 is employed to surround a portion of the periphery of the printed circuit board 11, electric components are not mounted to the sidewall block 15. The slit 15b extends through opposed side surfaces of the sidewall block 15, as shown in FIG. 1. Accordingly, as shown in FIG. 2(A), the sidewall block 15 is sandwiched between the relay and connector blocks 13, 14 when the sidewall block 15 is fitted to the side edge 11d of the printed circuit board 11.

In the case of the electrical connection box 10 constructed as described above, since the internal circuit is composed of the printed circuit board 11, weight can be reduced, compared to the conventional case. Also, by altering the position of the printed circuit board 11 or the configuration of the internal circuit, mounting positions of the fuse, relay, connector and sidewall blocks 12, 13, 14, 15 can be freely set. Thus, the electrical connection box 10 can be easily mounted to the vehicle body in a specified orientation.

Moreover, the mounting construction of the respective blocks 12, 13, 14, 15 to the electrical connection box 10 is not limited to that shown in FIG. 1. For example, a predetermined number of different types of electric component mounting blocks such as relay blocks, fuse blocks and diode blocks may be prepared in advance as common parts. The different types of electric component mounting blocks are produced with varying sizes and different numbers of electric component mounting portions. Similarly, a predetermined number of different types of external circuit connection blocks sidewall blocks may be prepared in advance as common parts. By preparing these common parts in advance, suitable blocks can be selectively employed in accordance with predetermined circuitry and structural constructions of the electrical connection box 10. Thus, many types of electrical connection boxes can be produced efficiently.

Figure 5A:
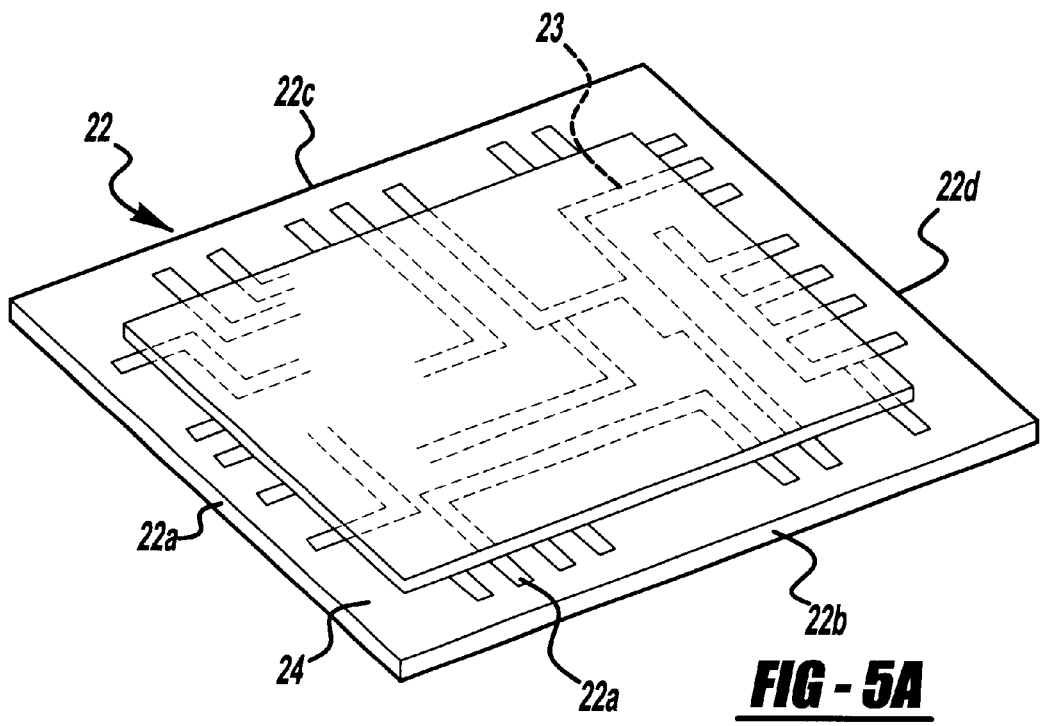
FIG. 5(A) is a perspective view showing a variation of a circuit board in which bus bars are employed according to the first embodiment of the present invention.

In relation to the construction of the electric circuit board, other than the double-sided circuit board, a single-sided circuit board may be employed as a printed circuit board constituting internal circuits. Also, the internal circuits may be formed, for example, by placing bus bars on a rectangular-shaped insulation plate, so that the end portions of the bus bars can be juxtaposed at side edges of the insulation plate for electrical connection with electric components and external circuits. Alternatively, a circuit board 22 as shown in FIG. 5(A) may be employed. The circuit board 22 is formed by molding upper and lower areas of bus bars 23 from a plastic material 24. The bus bars 23 are punched into circuits as shown in FIG. 5(A). Portions located in the proximity of peripheral edges 22a–22d remain exposed, constituting connection portions 22 for electrical connection with respective blocks.

Figure 5B:
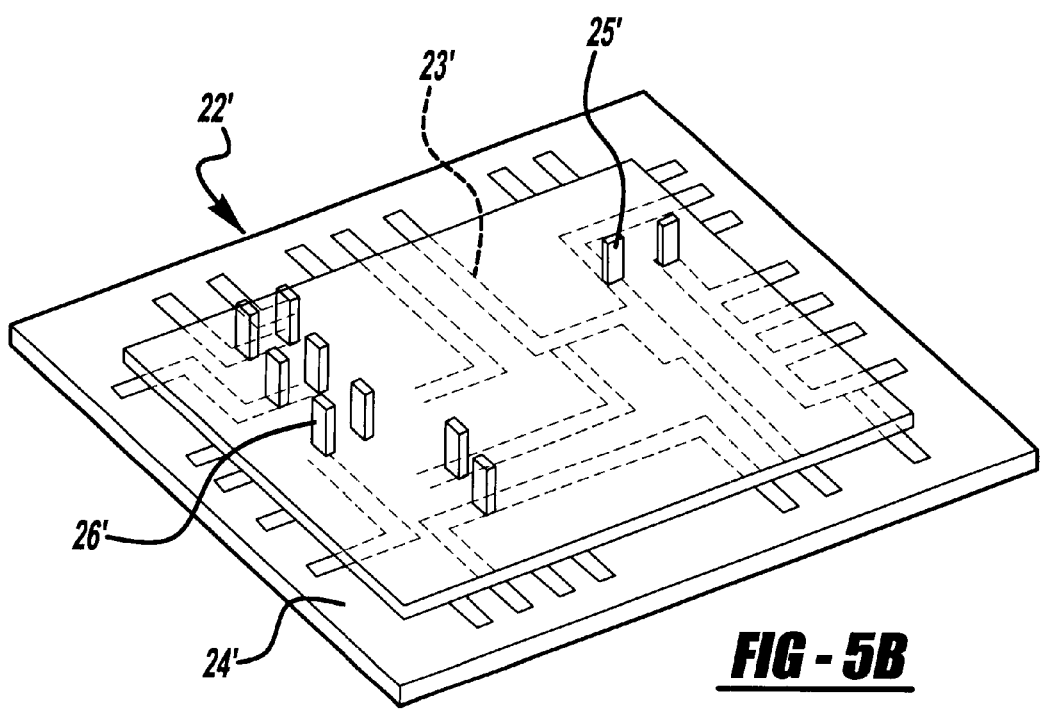
FIG. 5(B) is a perspective view showing a variation of a circuit board according to the first embodiment of the present invention, in which bus bars are employed.

Also, a circuit board 22' which is formed by molding bus bars 23' from a plastic material 24' as shown in FIG. 5(B) may be employed. In this circuit board 22', pressure gripping tabs 25' are provided which are press-fitted into the circuit board 22'. The tabs 25' project upwardly for electrical connection with electric components. Also, upstanding tabs 26' are formed from front ends of the bus bars 23'. The tabs 26' project upwardly for electrical connection with external circuits. Correspondingly, upper and lower casings which are used to cover this circuit board 22', are provided with electric component mounting portions and connector accommodating portions at locations corresponding to the locations of the pressure gripping and upstanding tabs 25', 26'. With this construction, the electrical connection box can make electrical connections with a larger number of electric components and external circuits.

Figure 6A:
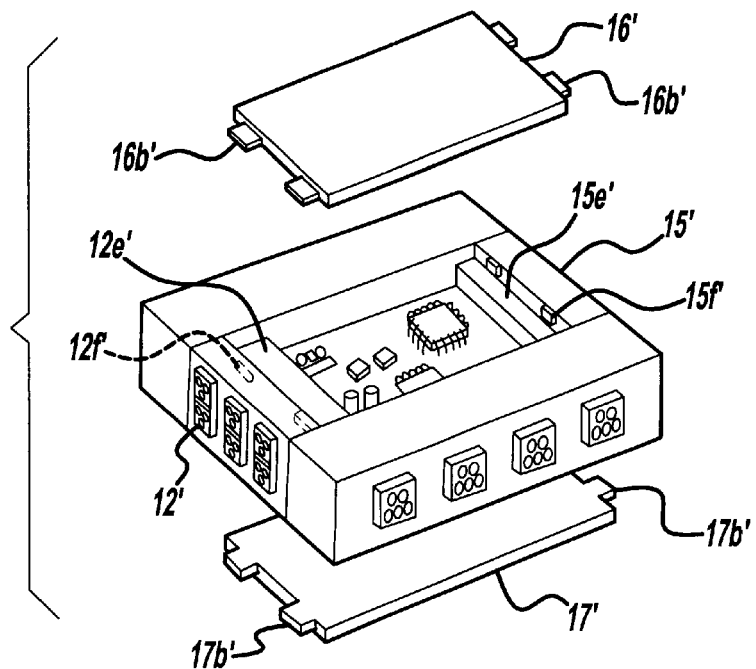
FIG. 6(A) is a perspective view showing a variation of a circuit board according to the first embodiment of the present invention, in which bus bars are employed.

Further, the construction of the upper and lower covers is not limited to the embodiment as shown in FIG. 1. For example, as shown in FIG. 6(A), case mounting portions 12e', 15e' may be recessed at their top and bottom surfaces of fuse and sidewall blocks 12', 15' disposed in an opposing relationship. The widths of upper and lower cases 16', 17' are adapted to the widths of central openings defined by the surrounding blocks. The lengths of the upper and lower cases 16', 17' are adapted, respectively, to the lengths from the case mounting recesses 12e' of the fuse block 12' to the case mounting recesses 15e' of the sidewall block 15'. Locking projections 16b', 17b' project laterally from the upper and lower cases 16', 17'. When mounting the upper and lower cases 16', 17', the locking projections 16b', 17b' lock to corresponding locking recesses 12f formed in inner upstanding side walls of mounting portions 12e', 15e', respectively. The upper and lower cases 16', 17' are accommodated within the central openings, so that the top and bottom surfaces of the upper and lower cases 16', 17' are flush with the top and bottom surfaces of the fuse and sidewall blocks 12', 15'. Accordingly, smooth surfaces with no steps can be formed. This improves the appearance of the electrical connection box 10.

Figure 6B:
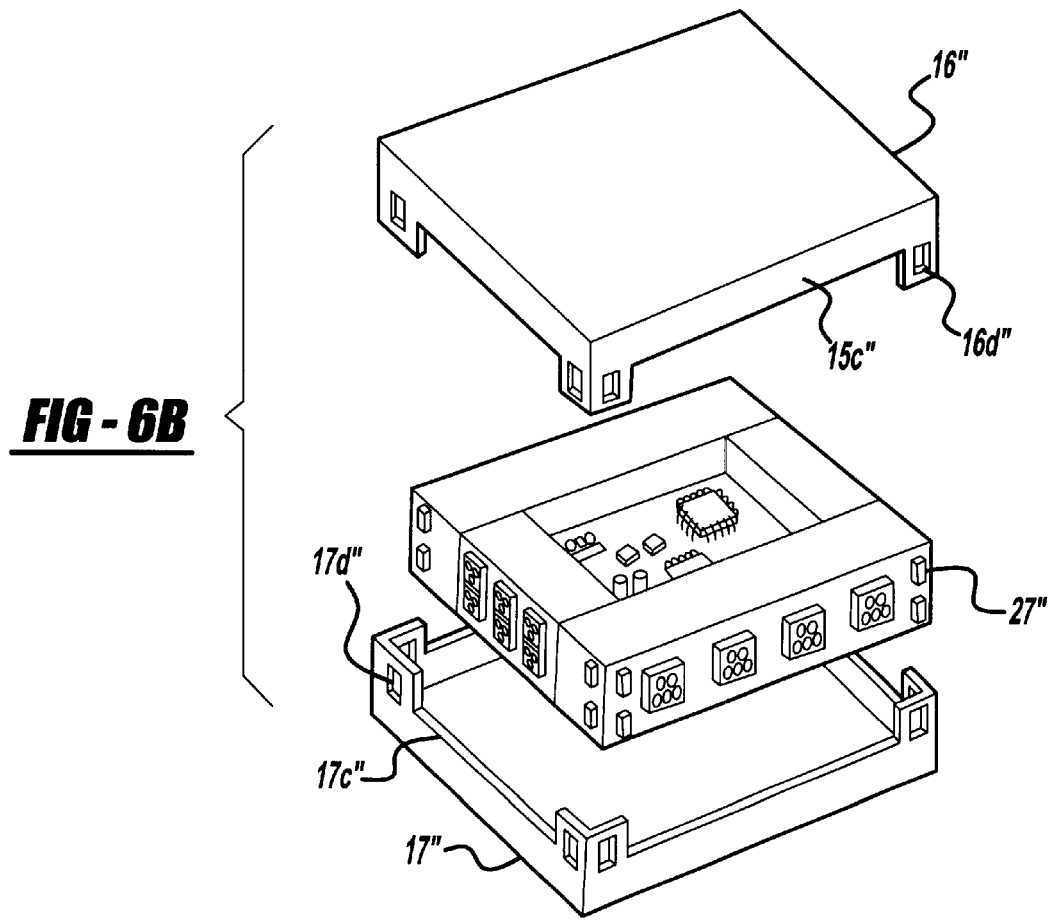
FIG. 6(B) is a perspective view showing the mounting condition of a variation of an upper cover according to the first embodiment of the present invention.

Furthermore, as in the case of upper and lower cases 16", 17" as shown in FIG. 6(B), frame portions 16c", 17c" surround peripheral portions of respective blocks. The frame portions 16c", 17c" project upwardly and downwardly from corner areas of the upper and lower cases 16", 17". The frame portions 16c", 17c" include locking holes 16d", 17d". Locking projections 27 project from corresponding locations at mounting surfaces in the proximity of the corner areas of the respective blocks. When the locking projections 27 lock to the locking holes 16d", 17d", the upper and lower cases 16", 17" are mounted so as to surround the peripheral portions of the respective blocks with the frame portions 16c", 17c". Thus, the frame portions 16c", 17c" serve to prevent the dislodgement of the respective blocks, thereby making the electrical connection box more secure.

Figure 7:
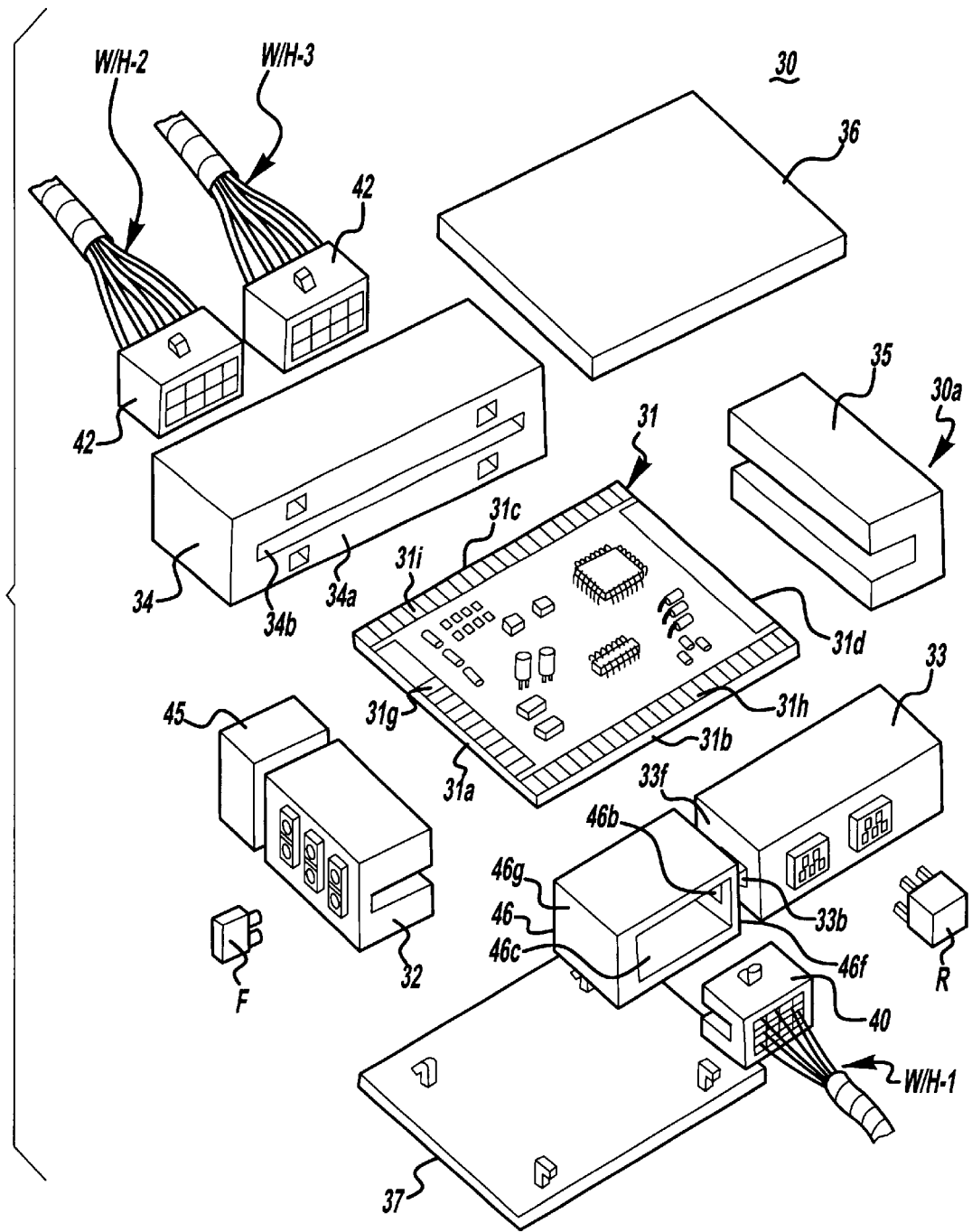
FIG. 7 is an exploded perspective view of an electrical connection box according to a second embodiment of the present invention.

FIG. 7 shows an electrical connection box 30 according to a second embodiment of the present invention. Like the first embodiment, blocks are mounted to respective side edges of a printed circuit board 31 and form sidewall portions 30a. Like the first embodiment, one block of a first connector block 34 is mounted to a side edge 31c. One block of a first sidewall block 35 is mounted to a side edges 31d. However, two blocks, a fuse block 32 and a second sidewall block 45, are mounted to a side edge 31a. Two blocks, a relay block 33 and a second connector block 46, are mounted to a side edge 31b.

In the case of internal circuits of an electrical connection box 30 according to the second embodiment, the number of fuse and relay connections decreases, while the number of external circuit connections increases compared to the electrical connection box 10 of the first embodiment. To meet the above conditions, the number of connection portions 31g of the side edge 31a is reduced. Also, approximately one half of the connection portions 31h of the side edge 31b is used for connection with relays. Approximately the other half of the side edge 31b is used for connection with the external circuits.

The fuse block 32 has the same configuration as the fuse block 12 of the first embodiment, except that the length of the fuse block 32 is shorter than that of the fuse block 12. Also, the sidewall block 45 has the same configuration as the sidewall block 15 of the first embodiment, except that the length of the sidewall block 45 is shorter than that of the sidewall block 15. In addition, relay block 33 has a configuration similar to relay block 13 of the first embodiment but it is cut by half. The relay block has a slit 33b which extends through and opens on a side surface 33f disposed adjacent the second connector block 46.

The second connector block 46, disposed adjacent the relay block 33, has a length equal to the length obtained from subtracting the entire length of the relay block 33 from the entire length of the relay block 13 of the first embodiment. A slit 46b extends through and opens at a side surface 46f disposed at the relay block side but does not open at the opposed side surface 46g. The configuration of the second connector block 46 is similar to that of the connector block 14 of the first embodiment, except for the above structural differences. A card-edge type connector 40 attached to an end of a wire harness W/H-1, constitutes an external circuit. The connector 40 is mounted in a connector accommodation portion 46e.

Figure 8A:
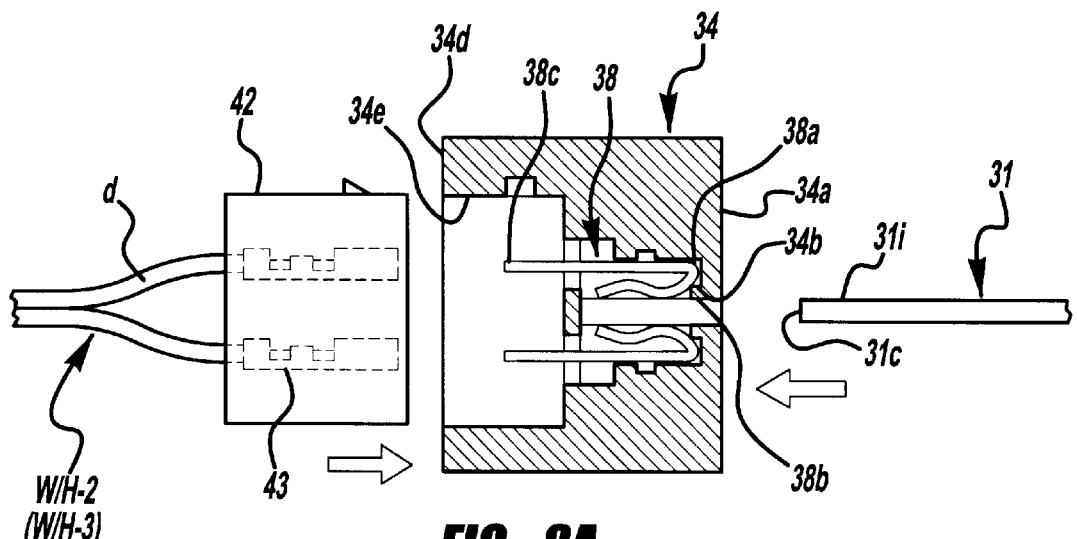
FIG. 8(A) is a cross-sectional view of a connector block for accommodating a female connector according to the second embodiment of the present invention.

In contrast with the second connector block 46, the first connector block 34 is adapted to accommodate a usual female-type connector 42. As shown in FIG. 8(A), the first connector block 34 has a connector accommodation portion 34e recessed at an outer surface 34d. A slit 34b is formed at an opposed, mounting surface 34a. A pair of intermediate connection terminals 38 are disposed inside the first connector block 34. The intermediate connection terminals 38 extend from the connector accommodation portion 34d side toward the slit 34b side and above and below the slit 34b, respectively.

The intermediate connection terminal 38, made of a conductive metal material, has a curved contact portion 38b formed by folding back one end 38a. The other end 38c forms a male tab which projects into the connector accommodating portion 34e to connect with the connector 42. The connectors 42, attached to ends of wire harness W/H-2, W/H-3, constitutes external circuits. The connector 42 has female terminals 43 which are inserted within cavities in connector 42. The terminals 43 are crimped on to wires d constituting the wire harness W/H-2, W/H-3.

The first connector block 34 is connected to the side edge of the printed circuit board 31, and then the connectors 42 of the external circuits are mounted in the connector accommodating portion 34e. At this stage, the female terminals 43 are connected to the connection portions 31i of the printed circuit board 31 via the intermediate connection terminals 38. This establishes an electrical connection between the internal and external circuits. Other elements such as a sidewall block 35, an upper case 36 and a lower case 37 have substantially the same configurations as those of the electrical connection box 10 of the first embodiment.

In the thus constructed electrical connection box 30, different types of blocks can be mounted to the side edges 31a, 31b according to the configurations of the internal circuits. Therefore, the electrical connection box 30 can be employed in various applications other than that shown in FIG. 7. For example, by preparing different types of blocks with various sizes and dimensions, the electrical connection box 30 can easily accommodate various specifications. In addition, three or more blocks can be fitted to one side edge of the electrical connection box 30. The construction of the electrical connection box 30 is also applicable in the variations of the electrical connection box 10 of the first embodiment.

Figure 8B:
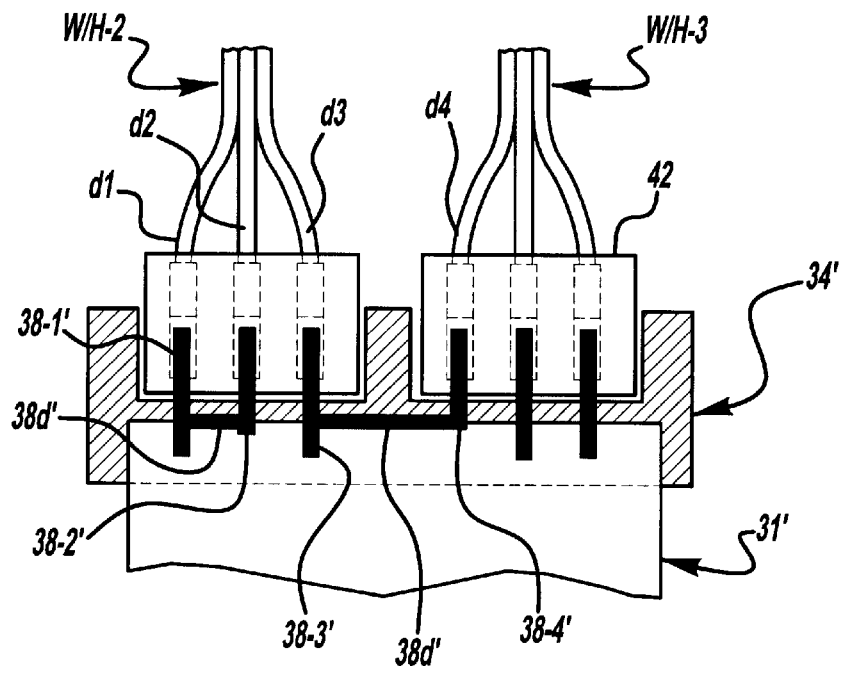
FIG. 8(B) is a schematic cross-sectional view, viewed from a plane, showing a variation of the connector block according to the second embodiment of the present invention.

Also, the first connector block 34, which receives the usual connector, is applicable in the electrical connection box 10 of the first embodiment. Further, as shown in FIG. 8(B), joint portions 38d' may connect first intermediate connection terminals 38-1', 38-2'. Joint portions 38d' may connect second intermediate connection terminals 38-3', 38-4'. Joint portions 38d' connect wires d1, d2 to constitute the wire harness W/H-2 of the external circuit and connect to the wire d3 of the wire harness W/H-3 which is different from the wires d1, d2 of the wire harness W/H-2.

By providing these types of joint portions 38d', a connection portion of a specific external circuit can be provided in the first connector block 34'. This decreases the number of internal circuits, thereby reducing the burden in designing the internal circuits of the printed circuit board. Of course, the first connector block 34 ' of the above variation is also applicable in the electrical connection box 10 of the first embodiment.

Figure 9:
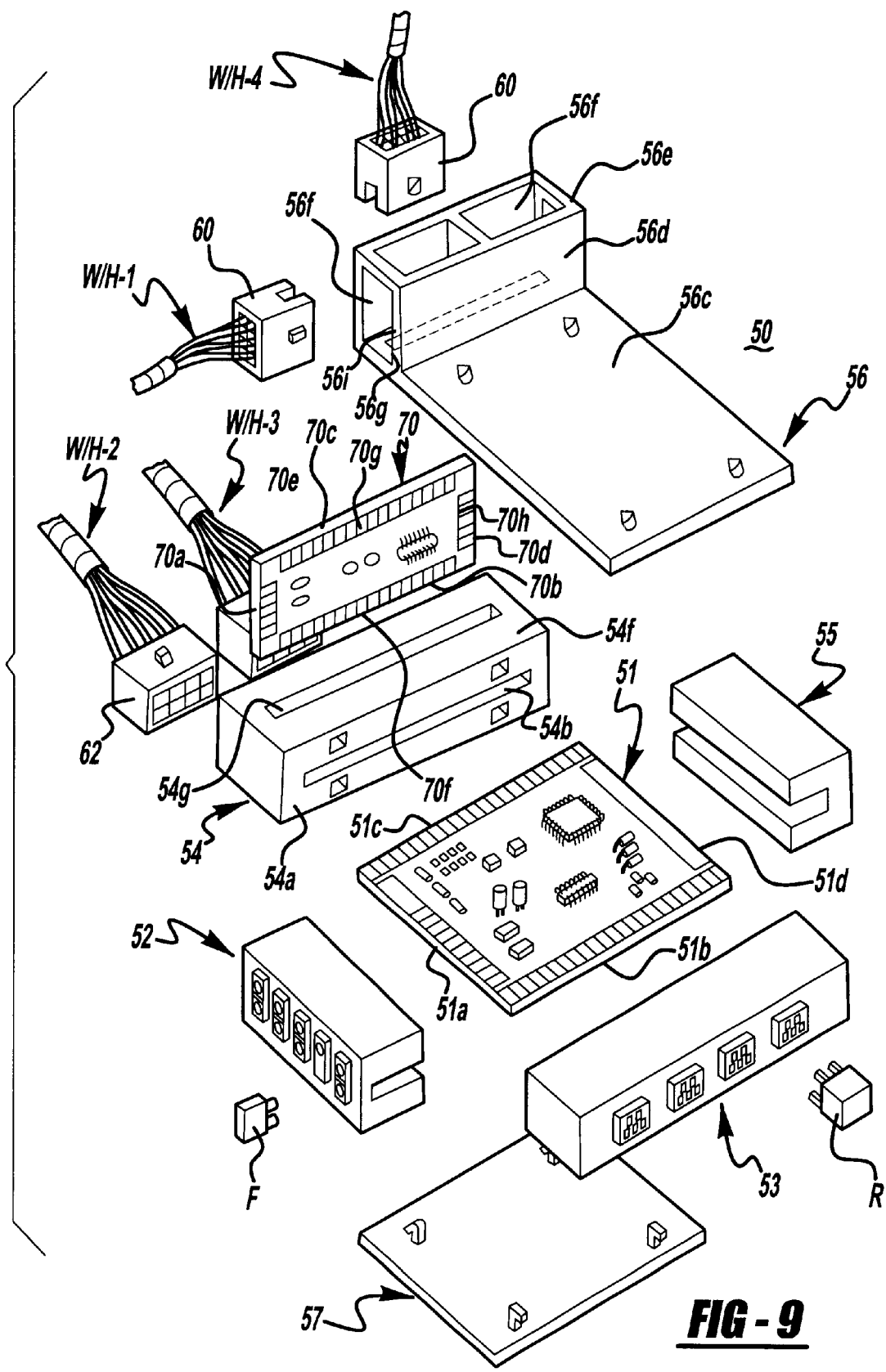
FIG. 9 is an exploded perspective view of an electrical connection box according to a third embodiment of the present invention.

FIG. 9 shows an electrical connection box 50 according to a third embodiment of the present invention. The number of internal circuits increases, compared to the electrical connection boxes 10, 30 of the first and second embodiments. Thus, in addition to a printed circuit board 51, constituting a main circuitry, a sub-printed circuit board 70 in the form of an auxiliary circuit board, is provided. The sub-printed circuit board 70 is insertable into a vertically-extending second slit 54g formed at an upper surface 54f of a connector block 54.

Figure 10A:
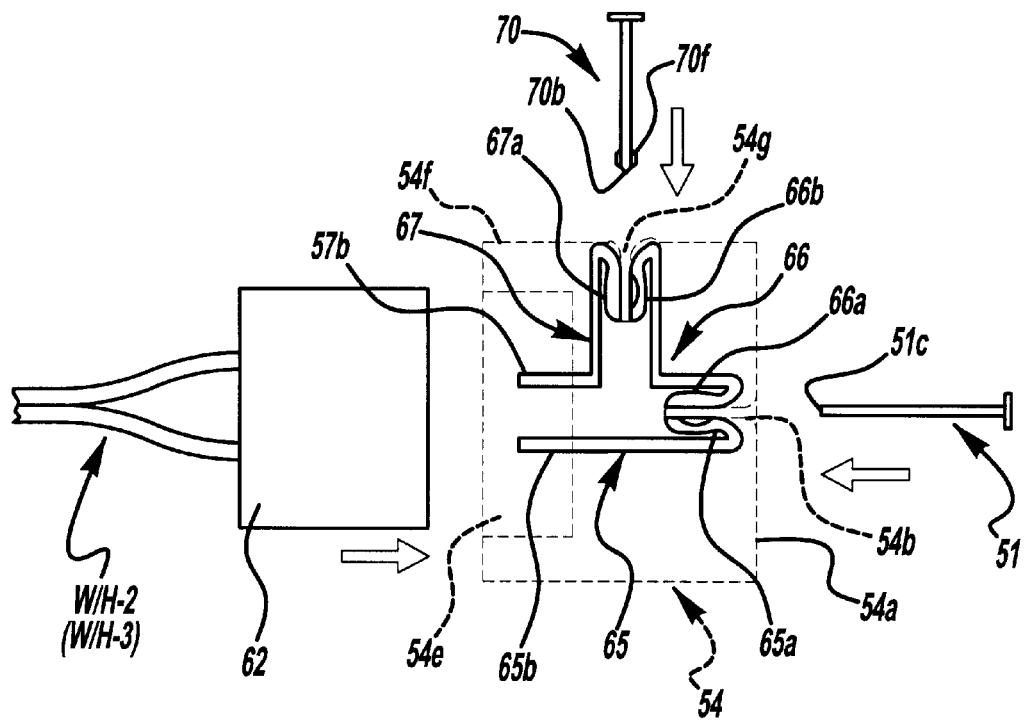
FIG. 10(A) is a schematic view showing the connection of a connector block according to the third embodiment of the present invention.

The sub-printed circuit board 70 is of a rectangular shape, like the printed circuit board 51, and is provided with connection portions 70e–70h formed at peripheral side edges 70a–70d. The connector block 54 has a similar configuration to the first connector block 34 of the second embodiment, except that the second slit 54g is formed at the upper surface 54f to receive the sub-printed circuit board 70. As shown in FIG. 10(A), first, second, and third intermediate connection terminals 65, 66, 67 are provided.

The first intermediate connection terminal 65 has the same configuration as the intermediate connection terminal 38 of the second embodiment. The first intermediate connection terminal 65 has a contact portion 65a disposed interiorly and downwardly of a first slit 54b provided at a mounting surface 54a side of the connector block 54. A male tab 65b projects into a connector accommodation portion 54e of the connector block 54. The second intermediate connection terminal 66 is bent at substantially 90 degrees at a central portion. The terminal 66 includes contact portions 66a, 66b at its opposite ends. The contact portion 66a is disposed interiorly and upwardly of the first slit 54b. The contact portion 66b extends vertically, and is disposed at one side of the second slit 54g. In addition, the third intermediate connection terminal 67 is formed by bending an intermediate connection terminal of the type of the first intermediate connection terminal 65 at substantially 90 degrees at its central portion in a longitudinal direction. The contact portion 67a extends vertically, and is disposed at the other side of the second slit 54g. The male tab 67b projects into the connector accommodation portion 54e.

The connector block 54 of the above construction is mounted to the side edge 51c of the printed circuit board 51, via the first slit 54b. Subsequently, the sub-printed circuit board 70 is inserted into the second slit 54g. The connector 62 is fitted in the connector accommodation portion 54e. Consequently, the external circuits of the wire harness W/H-2 and the internal circuits of the printed circuit board 51 are in electrical connection via the intermediate connection terminal 65. In addition, the circuits of the printed circuit board 51 and the circuits of the sub-printed circuit board 70 are in electrical connection via the second intermediate connection terminal 66. The circuits of the sub-printed circuit board 70 and the external circuits of the wire harness W/H-2 are in electrical connection via the third intermediate connection terminal 67.

Moreover, in contrast with the upper cover 16 of the first embodiment, an upper cover 56 extends sufficiently to cover the upper surface 54f of the connector block 54, forming an extended area. A box portion 56d projects from the extended area. The box portion 56d is configured to cover the sub-printed circuit board 70 that projects upwardly when the sub-printed circuit board 70 is inserted into the second slit 54g. A plurality of connector accommodation portions 56f are recessed at upper and side surfaces 56e, 56g of the box portion 56d. These connector accommodation portions 56f form a big hollow inside the box portion 56d, communicating with one another inside the box portion 56d. In addition, a lower slit 56i is formed at a lower surface of the box portion 56d. The lower slit 56i is continuous with the respective connector accommodation portions 56f.

When the upper cover 56 is mounted in the same way as in the first embodiment, the sub-printed circuit board 70 projects into the box portion 56d, via the lower slit 56i. Thus, the connection portions 70e, 70g, 70h of side edges 70a, 70c, 70d are respectively disposed in the box portion 56d, as in the case of the first embodiment shown in FIG. 4(B). When card-edge type connectors 60, secured to wire harnesses W/H-1, W/H-4 constituting external circuits, are mounted in the connector accommodation portion 56f, the external circuits of the wire harnesses W/H-1, W/H-4 can be electrically connected to the internal circuits of the sub-printed circuit board 70. Other elements such as a fuse block 52, a relay block 53, a sidewall block 55 and a lower cover 57 have similar configurations similar to those of the first embodiment.

In this way, the electrical connection box 50 can easily accommodate an increased number of circuits. The connect box 50 provides flexibility to a design change or the like by selectively employing suitable blocks, upper covers or sub-printed circuit boards. Thus, it is not necessary to design and develop new dies and molds. The electrical connection box 50 is not limited to the configuration as described in FIG. 9. The electrical connection box 50 can be employed in the applications of the first and second embodiments and their variations. Further, a plurality of sub-printed circuit boards may be mounted by changing the configurations of the surrounding blocks. Also, sub-printed circuit boards may be mounted at a lower surface side. In the event where the sub-printed circuit board is mounted at the lower surface side, a box portion is provided on the lower cover 57 like the upper cover 56. In addition, the box portion may be configured to accommodate various electric components.

Figure 10B:
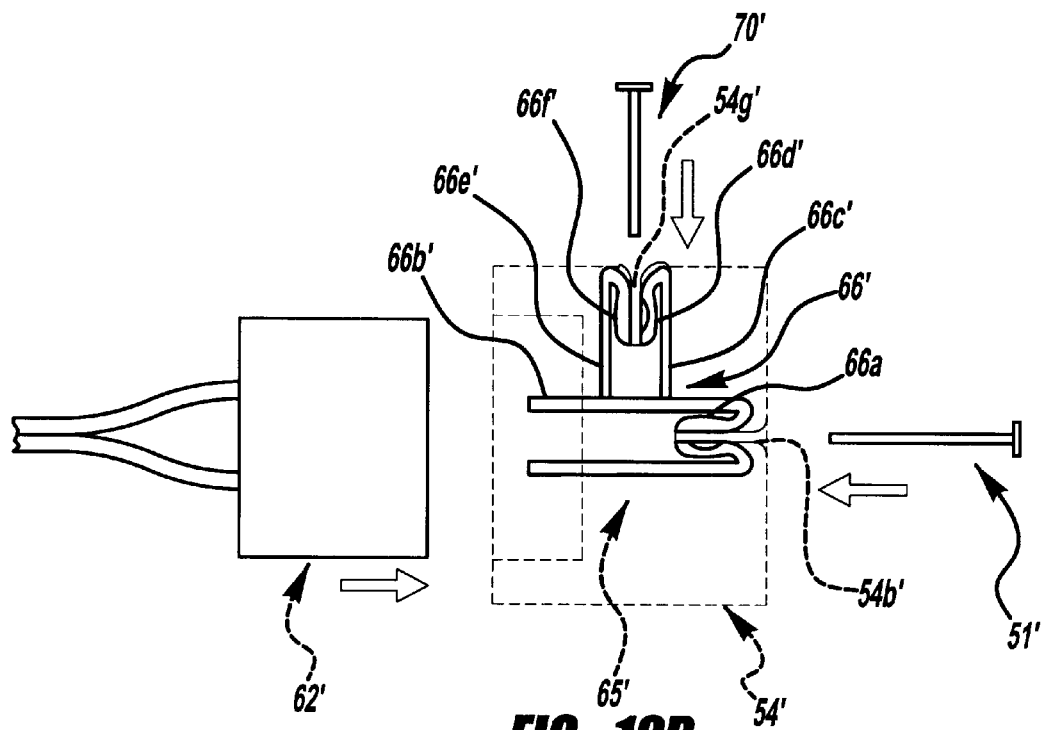
FIG. 10(B) is a schematic view showing a variation of the connector block according to the third embodiment of the present invention.

In addition, as shown in FIG. 10(B), the connector intermediate connection terminal of the connector block 54' may be composed of a fourth intermediate connection terminal 65' and a fifth intermediate connection terminal 66'. The fourth intermediate connection terminal 65' has the same configuration as the first intermediate connection terminal 65 of FIG. 10(A). The fifth intermediate connection terminal 66' has two upstanding terminal portions 66c', 66e' projecting from a central portion of a base portion. The base portion of the fifth intermediate connection terminal 66' has a contact portion 66a' at one end, and a male tab portion 66b' at the other end. Further, the upstanding terminal portions 66c', 66e' have contact portions 66d', 66f', and project toward the opposed side areas of an opening of the second slit portion 54g'. This fifth intermediate connection terminal 66' makes electrical connections between the printed circuit board 51' and the sub-printed circuit board 70' as well as between the circuit boards 51', 70' and the external circuits.

Figure 11:
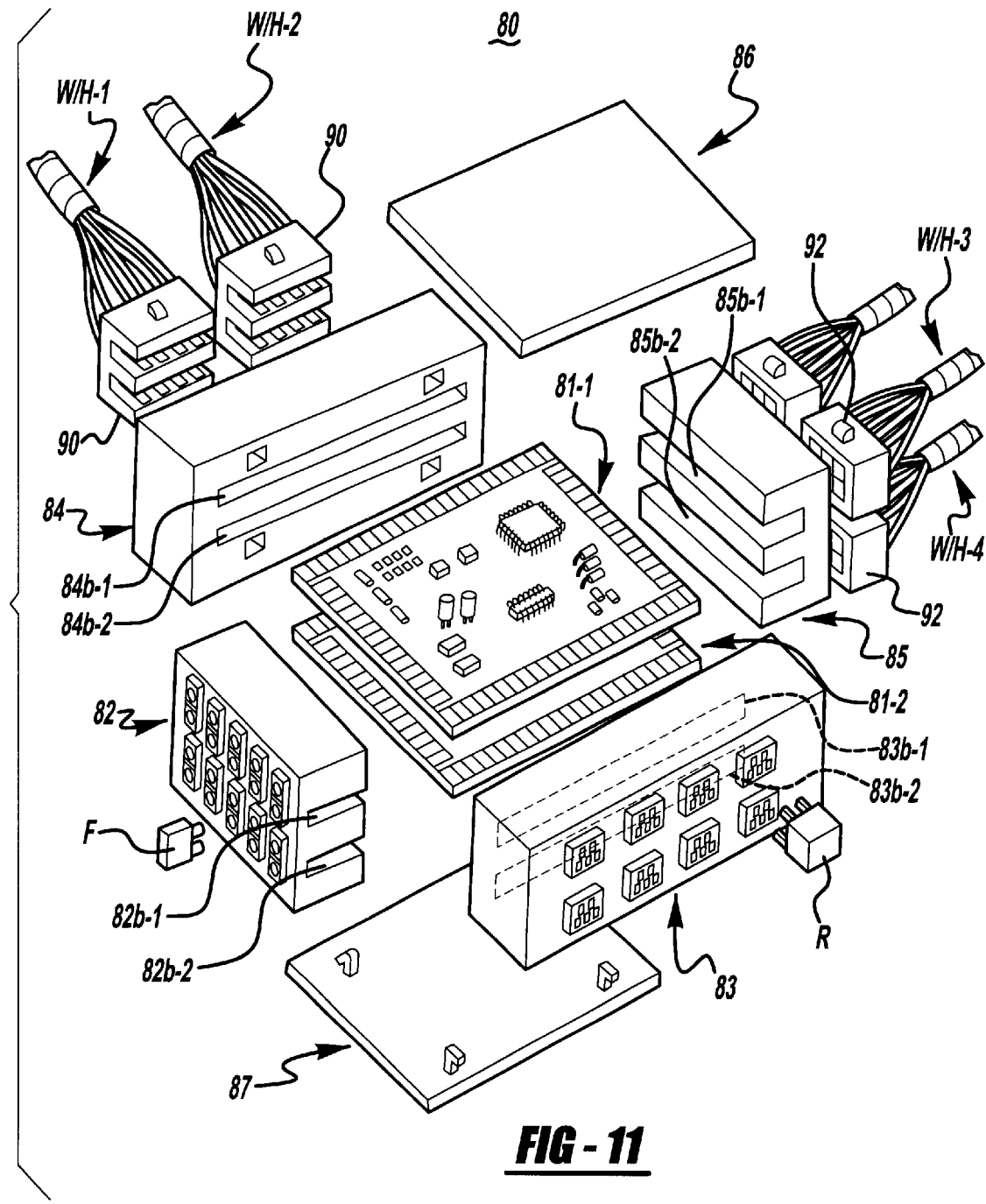
FIG. 11 is an exploded perspective view showing an electrical connection box according to a fourth embodiment of the present invention.

FIG. 11 shows an electrical connection box 80 according to a fourth embodiment of the present invention. The electrical connection box 80 has a larger number of internal circuits than the electrical connection box 10 of the first embodiment. Thus, the electrical connection box 80 is composed of a total of two layers of first and second printed circuit boards 81-1, 81-2 which are stacked at spaced apart locations in an upward-downward direction. Correspondingly, respective peripheral blocks 82–85 are provided with a total of two slits of first and second slits 82b-1–85b-1, 82b-2–85b-2 which are spaced apart in the upward-downward direction. Other configurations are similar to those of the electrical connection box 10 of the first embodiment. Moreover, the construction of the electrical connection box 80 can be employed in the first to third embodiments and their variations.

Figure 12:
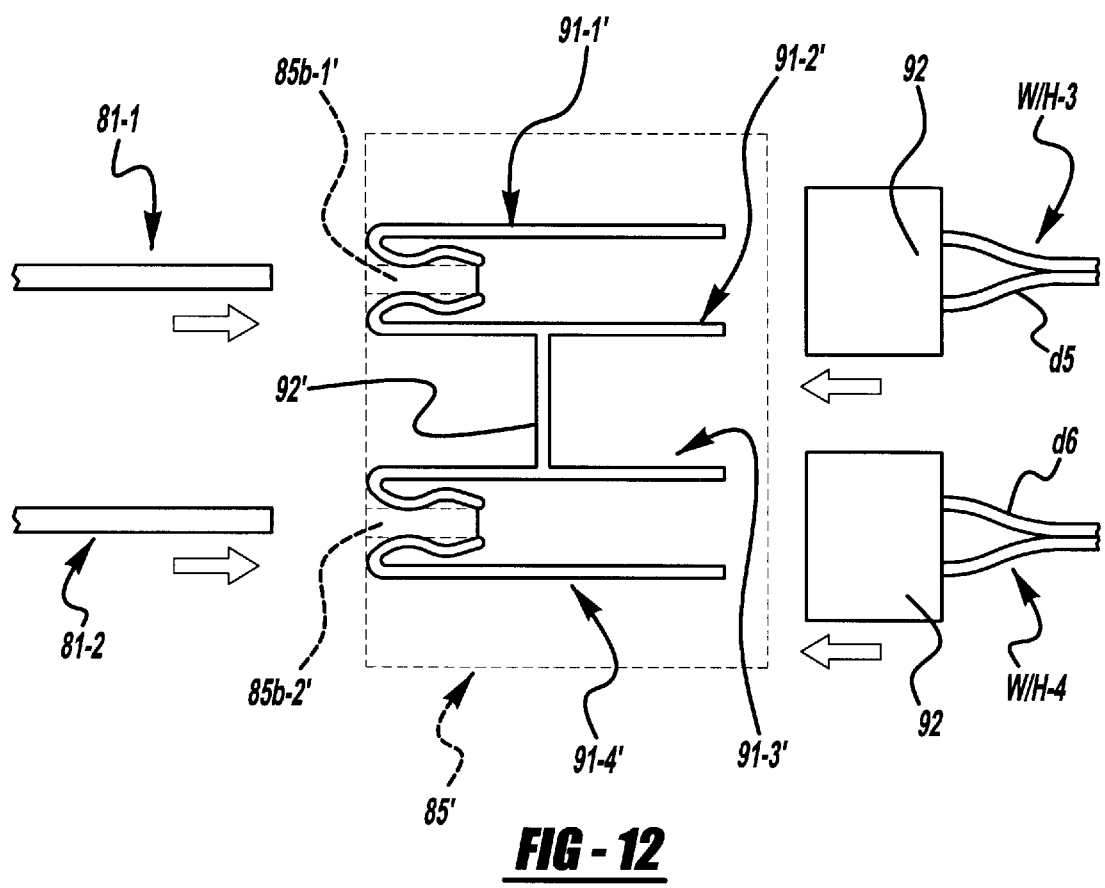
FIG. 12 is a schematic view showing a variation of a connector block according to the fourth embodiment of the present invention.
Figure 13:
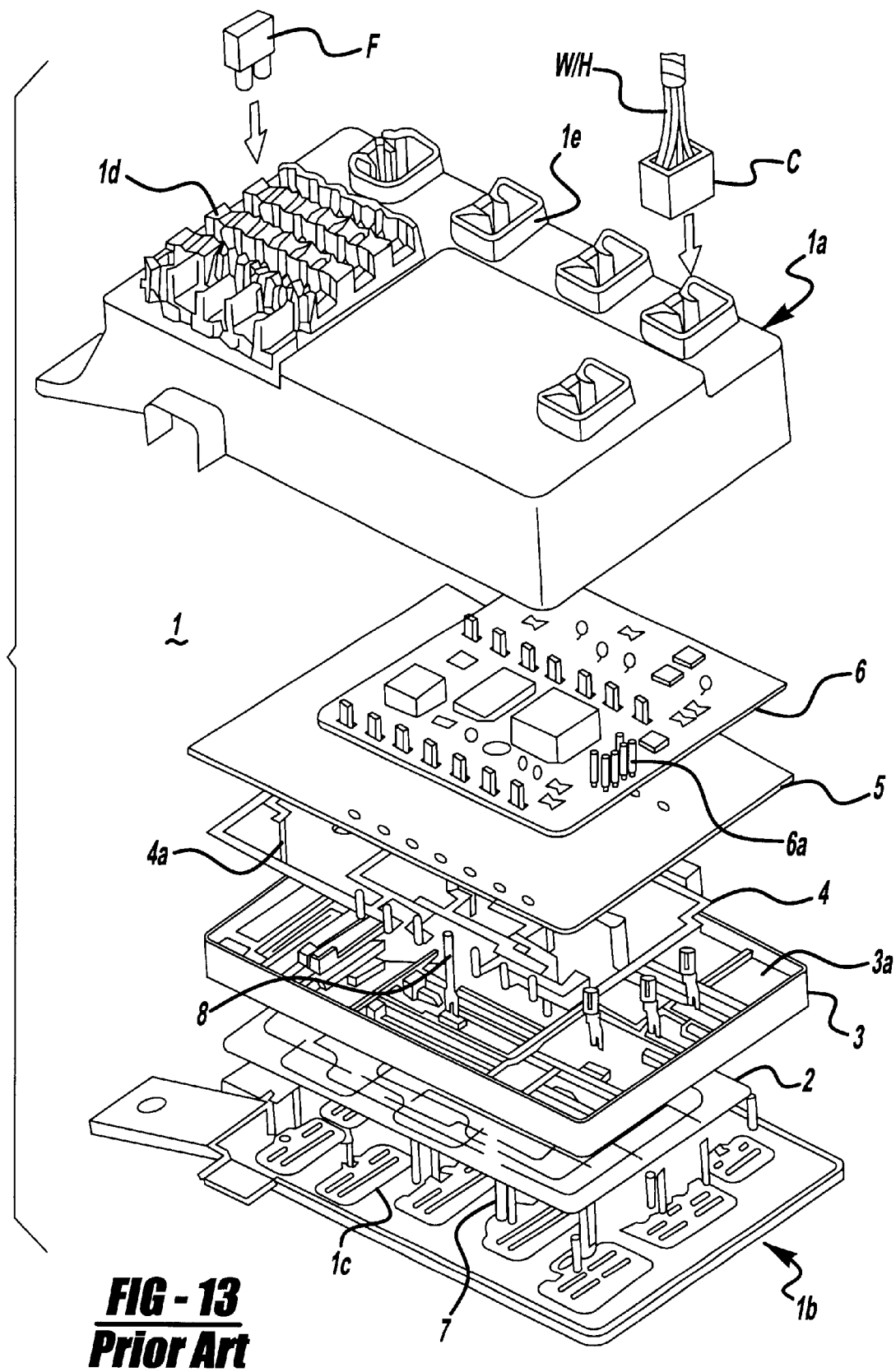
FIG. 13 is an exploded perspective view showing a conventional electrical connection box.

Further, the number of printed circuit boards constituting the internal circuits of the electrical connection box 80 is not limited to two, but it can be increased to 3 or more according to the number of internal circuits required. Furthermore, it is possible to employ the printed circuit board and the circuit board formed from a bus bar such as that shown in FIGS. 5(A) and 5(B) together. Furthermore, in a connector block 85' for accommodating a usual female connector 92, a joint portion 92' may be provided which connects internal connector intermediate connection terminals 91-2', 91-3' as shown in FIG. 12. By providing the joint portion 92', an electrical connection can be made between wires d5 of a wire harness W/H-3 and wires d6 of a wire harness W/H-4. Thus, it is not necessary to form in the internal circuit a circuit portion for the electrical connection of the wires d5, d6. Accordingly, it is possible to reduce burden in designing the internal circuits. Further, since the joint portion 92' makes an electrical connection between the circuits of the first printed circuit board 81-1 and the circuits of the second printed circuit board 81-2, a specific intermediate connection terminal for connection of the circuits of these circuit boards 81-1, 81-2 can be omitted.

As is clear from the above description, the electrical connection box according to the present invention is configured so that many types of blocks can be mounted to a circuit board having an internal circuit, in accordance with the construction of the internal circuit. Thus, it is easy to produce various electrical connection boxes according to different vehicle specifications. This eliminates the need to produce various dies and molds according to different specifications, reducing production cost. Moreover, by preparing in advance as standard or common parts a predetermined number of different types of surrounding blocks having various dimensions, it is easy to cope with a circuit construction change or a circuit increase, resulting from a subsequent design change or an optional function addition, cost-effectively.

Further, since the blocks can be selectively mounted to any desired peripheral portions, it is possible to install the electrical connection box in a suitable orientation which allows the ready replacement of electric components such as fuses. Thus, it is possible to improve the degree of freedom in setting the installation direction of the electrical connection box to the vehicle body. Furthermore, since a printed circuit board can be employed to form internal circuits, the weight of the electrical connection box itself can be reduced.

While the invention has been described in the specification and illustrated in the drawings with reference to preferred embodiments, it will be understood by those skilled in the art that various changes may be made and equivalents may be substituted for elements thereof without departing from the scope of the invention as defined in the claims. In addition, many modifications may be made to adapt a particular situation or material to the teachings of the invention without departing from the essential scope thereof. Therefore, it is intended that the invention not be limited to the particular embodiment illustrated by the drawings and described in the specification as the best mode presently contemplated for carrying out this invention, but that the invention will include any embodiments falling within the foregoing description and the appended claims.

What is claimed is:

1. An electrical connection box comprising:
   an electric circuit board including internal circuits and connection portions; and
   a plurality of blocks selectively mounted on the periphery of the electric circuit board and forming sidewalls surrounding the periphery of the electric circuit board, wherein the plurality of blocks mounted to the electric circuit board include:
   (a) at least one electric component mounting block accommodating an electric component which is adapted for an electrical connection with the connection portions of the electric circuit board,
   (b) at least one external circuit connection block accommodating an electrical connector which is adapted for an electrical connection of an external circuit to the connection portions of the electric circuit board, and
   (c) at least one solid, sidewall block for forming a portion of the sidewalls.

2. The electrical connection box of claim 1, further comprising upper and lower covers fixedly mounted to at least one of the selected ones of the blocks and covering the electric circuit board from above and below.

3. The electrical connection box of claim 1, wherein the electric circuit board includes side edges on its periphery, and wherein the blocks each comprise a slit which opens to receive the side edge of the electric circuit board.

4. The electrical connection box of claim 3, wherein the connection portions are arranged side by side on the side edges, at least one the electric component mounting block and the at least one external circuit connection block each including electrical terminals which are arranged side by side and which engage the corresponding connection portions of the side edges for electrical connection when the selected ones of the electric component mounting blocks and the selected ones of the external circuit connection blocks are mounted to the side edges of the electric circuit board via the slits.

5. The electrical connection box of claim 4, wherein the terminals comprise intermediate connection terminals that electrically connect contact portions of the electric component and the connector accommodated in the selected ones of the electric component mounting blocks and the selected ones of the external circuit connection blocks, to the corresponding connection portions of the side edges of the electric circuit board.

6. The electrical connection box of claim 5, further comprising at least one joint portion electrically connecting at least two of the intermediate connection terminals.

7. The electrical connection box of claim 3, wherein the electric circuit board is rectangular-shaped, having four side edges on the periphery, and wherein at least four selected ones of the blocks are mounted to the four side edges of the electric circuit board, surrounding the periphery of the electric circuit board.

8. The electrical connection box of claim 7, wherein the at least four selected ones of the blocks are selected according to predetermined circuitry and structural constructions of the electrical connection box.

9. The electrical connection box of claim 3, wherein a plurality of selected ones of the blocks are mounted to the side edge of the electric circuit board, wherein each of the plurality of selected ones of the blocks has a length shorter than a length of the side edge.

10. The electrical connection box of claim 2, wherein the external circuit connection block comprises a connector accommodating portion at a first surface thereof for accommodating an electrical connector connected to a first wire harness constituting a first external circuit, a first slit which is formed in a second surface disposed substantially parallel to the first surface and which is dimensioned for receiving a side edge of the electric circuit board in a first direction, and a second slit formed in a third surface disposed adjacent the first and second surfaces and extending substantially perpendicularly to the first and second surfaces, the second slit being dimensioned for receiving a first side edge of a auxiliary circuit board in a second direction substantially perpendicular to the first direction, and wherein one of the upper and lower covers comprises an external circuit connector port thereon for accommodating a second connector connected to a second wire harness constituting a second external circuit and a third slit dimensioned for receiving a second side edge, which is opposite to the first side edge of the auxiliary circuit board, in a third direction opposite to the second direction.

11. The electrical connection box of claim 10, wherein the external circuit connection block comprises an intermediate connection terminal having three contact fingers, the first contact finger of the intermediate connection terminal for an electrical connection with a connection portion provided on the side edge of the electric circuit board, the second contact finger extending in a direction opposite to the first contact finger for an electrical connection with a contact member accommodated in the first connector, and the third contact finger extending in a direction substantially perpendicular to the first and second contact fingers for an electrical connection with a connection portion provided on the first side edge of the auxiliary circuit board.

12. The electrical connection box of claim 1, wherein the selected ones of the blocks each comprise a plurality of slits spaced apart at a predetermined distance in an upward-downward direction, wherein a plurality of electric circuit boards are mounted to the slits so that the electric circuit boards are stacked and spaced apart at the predetermined distance in the upward-downward direction.

13. The electrical connection box of claim 12, wherein the selected ones of the blocks each comprise a plurality of intermediate connection terminals arranged side by side and being spaced apart at the predetermined distance in the upward-downward direction, wherein at least one joint portion is provided that connects at least two of the intermediate connection terminals.

14. The electrical connection box of claim 1, wherein the electric circuit board comprises a printed circuit board.

15. The electrical connection box of claim 1, wherein the electric circuit board comprises a bus bar.

16. A method of producing an electrical connection box comprising:

providing an electric circuit board constituting internal circuits and having connection portions;

preparing a predetermined number of different types of electric component mounting blocks for accommodating at least one electric component therein for an electrical connection with the connection portions;

preparing a predetermined number of different types of external circuit connection blocks for accommodating at least one external circuit connector for an electrical connection with the connection portions;

preparing a predetermined number of different types of solid sidewall blocks; and selectively mounting to portions of the periphery of the electric circuit board a plurality of blocks from among the electric component mounting blocks, the external circuit connection blocks and the sidewall blocks in accordance with predetermined circuitry and structural constructions of the electrical connection box, wherein the plurality of the blocks form sidewalls that surround the periphery of the electric circuit board.

17. The method of claim 16, further comprising mounting upper and lower covers to at least one of the selected ones of the blocks, thereby covering the electric circuit board from above and below.

18. The method of claim 16, wherein the electric circuit board is produced for a particular vehicle specification and is accommodated in the electrical connection box, and wherein the electric component mounting blocks, the external circuit connection blocks and the sidewall blocks are produced as common parts so that the blocks can be selectively mounted to the electric circuit board in accordance with the particular vehicle specification.

* * * * *

UNITED STATES PATENT AND TRADEMARK OFFICE
CERTIFICATE OF CORRECTION

PATENT NO. : 6,597,578 B2
DATED : July 22, 2003
INVENTOR(S) : Shiina et al.

It is certified that error appears in the above-identified patent and that said Letters Patent is hereby corrected as shown below:

Column 3,
Line 16, "lease" should be -- least --

Column 8,
Line 50, after "blocks" ($1^{st}$ occurrence), insert -- and --

Column 9,
Line 66, "edges" should be -- edge --

Column 12,
Line 56, "connect" should be -- connection --

Column 14,
Line 63, "at least one the" should be -- the at least one --

Column 15,
Line 42, ($2^{nd}$ occurrence), "a" should be -- an --

Signed and Sealed this

Twenty-second Day of June, 2004

JON W. DUDAS
*Acting Director of the United States Patent and Trademark Office*